US007945870B2

(12) United States Patent
Kahng et al.

(10) Patent No.: US 7,945,870 B2
(45) Date of Patent: May 17, 2011

(54) METHOD AND APPARATUS FOR DETECTING LITHOGRAPHIC HOTSPOTS IN A CIRCUIT LAYOUT

(75) Inventors: Andrew B. Kahng, Del Mar, CA (US); Chul-Hong Park, San Diego, CA (US); Xu Xu, San Diego, CA (US)

(73) Assignee: The Regents of the University of California, Oakland, CA (US)

( * ) Notice: Subject to any disclaimer, the term of this patent is extended or adjusted under 35 U.S.C. 154(b) by 286 days.

(21) Appl. No.: 11/725,396

(22) Filed: Mar. 19, 2007

(65) Prior Publication Data

US 2008/0235645 A1 Sep. 25, 2008

(51) Int. Cl.
*G06F 17/50* (2006.01)
(52) U.S. Cl. ............ 716/52; 716/111; 716/112; 716/136
(58) Field of Classification Search .................. 716/4–5, 716/19–21, 52, 111, 112, 136
See application file for complete search history.

(56) References Cited

U.S. PATENT DOCUMENTS

2008/0079725 A1* 4/2008 Sagalov ........................ 345/440
2008/0295061 A1* 11/2008 Eisenmann et al. ............ 716/21

OTHER PUBLICATIONS

Chiang et al., "Fast and Efficient Phase Confict Detection and Correction in Standard-Cell Layout," ACM, 2005, pp. 149-156.*
Chiang et al., "Bright-Field AAPSM Conflict Detection and Correction," IEEE, 2005, pp. 1-6.*
Kahng et al., "Fast dual graph-based hotspot detection," SPIE Digital Library, Oct. 20, 2006, p. 1.*
Kahng et al. (Fast Dual Graph Based Hotspot Detection), Proc. 27th BACUS Symposium on Photomask Technology and Management, 628-04, Jan. 2006, pp. 1-8.*

Kahng et al., "Fast Dual-Graph Based Hot-Spot Detection,", Proc. 27$^{th}$ BACUS Symposium on Phtomask Technology and Management, 6281-04, Jan. 2006, one page.*
Amandine Borjon, et al., "High Accurarcy 65nm OPC Verification: Full Process Window Model vs. Critical Failure ORC", 2004, in *Proc. SPIE Microlithography*, pp. 1190-1201.
Juhwan Kim, et al., "Hotspot detection on post-OPC layout using fill-chip simulation-based verification tool: a case study with aerial image simulation", 2003, in *Proc Mircolithography*, pp. 919-923.
K. Hashimoto, S. Usui, S. Nojima, S. Tanaka, E. Yamanaka and S. Inoue, "Hot Spot Management in Ultra-low k1 Lithography", 2005, in *Proc. SPIE Microlithography*, vol. 6156, pp. 1207-1219.
S. Nojima, S. Mimotogi, M. Itoh, O. Ikenaga, S. Hasebe, K. Hashimoto, S. Inoue, M. Goto and I. Mori, "Flexible mask specifications", 2002, *Proc. SPIE 22nd Annual BACUS Symposium on Photomask Technology*, vol. 4889, pp. 187-196.
M. Cote and P. Hurat, "Standard Cell Printability Grading and Hot Spot Detection", 2005, *Intl. Symp. on Quality of Electronic Design*, pp. 264-269.
C.-H. Park, Y-H. Kim, J.-S. Park, K.-D. Kim, M.-H. Yoo and J.-T. Kong, "A Systematic Approach to Correct Critical Patterns Induced by the Lithography Process at the Full-Chip Level", *Proc. International Society for Optical Engineering (SPIE) Symposium on Microlithography*, 1999, vol. 3679, pp. 622-629.
E. Sahouria, Y Granik, N. Cobb and O. Toublan, "Full-Chip Process Simulation for Silicon DRC", *International Conference on Modeling and Simulation of Mircosystems (MSM)*, 2000, pp. 32-35.
M. Cote and P. Hurat, "Layout Printability Optimization Using a Silicon Simulation Methodology", 2004, *Intl. Symp. on Quality of Electronic Design*, pp. 159-164.
Y. Cao, Y.- W. Lu, L. Chen and J. Ye, "Optimized Hardware and Software for Fast, Full Chip Simulation", 2005, *Proc. International Society for Optical Engineering (SPIE) Symposium on Microlithography*, vol. 5754, pp. 407-414.

* cited by examiner

*Primary Examiner* — Vuthe Siek
(74) *Attorney, Agent, or Firm* — Greer, Burns & Crain Ltd.

(57) ABSTRACT

Method for detecting hotspots in a circuit layout includes constructing a layout graph having nodes, corner edges and proximity edges from the circuit layout, converting the layout graph to a corresponding dual graph, and iteratively selecting edges and nodes having weights greater than a predetermined threshold value at each iteration as hotspots.

15 Claims, 8 Drawing Sheets

FIG. 8
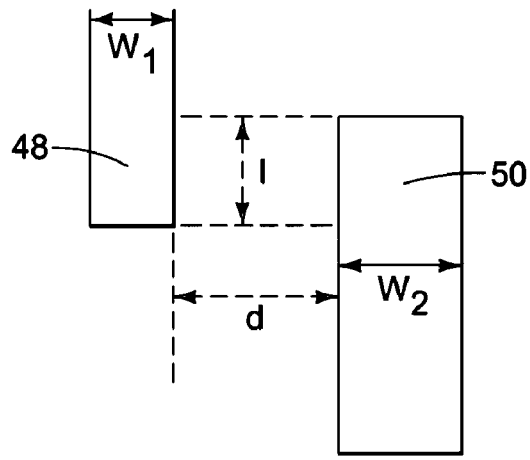
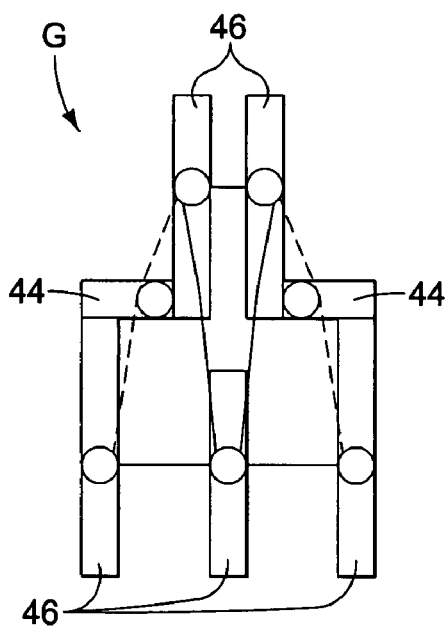
○ node
—— proximity edge
--- corner edge
FIG. 7
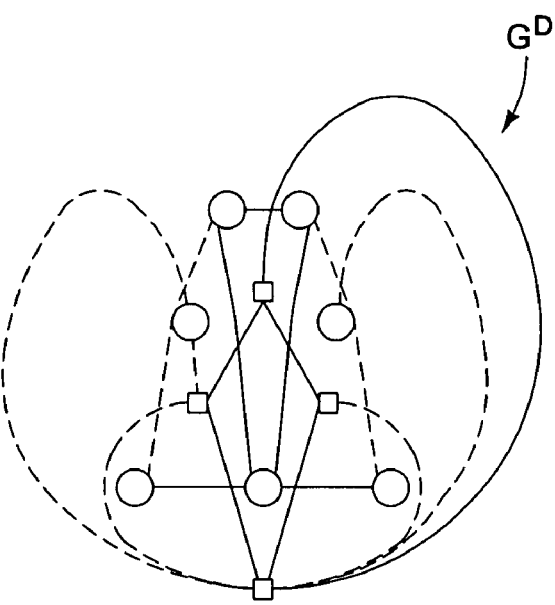
□ dual node
—— proximity dual edge
--- corner dual edge
FIG. 9

| Input: Layout $L, \epsilon_0, \epsilon_1, \epsilon_2, d_0$ |
|---|
| Output: A list of hotspots in $L$ |
| 1. Construct layout graph $G$ from $L$. $S \leftarrow (/)$ |
| 2. For all edges $e$ whose weight $> \epsilon_0$ (Edge-level detection) |
| 3.     $S \leftarrow S \cup \{e\}$ |
| 4.     Delete $e$ from $G$ |
| 5. Perform graph planerization to delete one of the crossing edges |
| 6. Construct dual graph $G^D$ from $G$ |
| 7. For all dual nodes $n$ whose weight $> \epsilon_1$ (Face-level detection) |
| 8.     $S \leftarrow S \cup \{n\}$ |
| 9.     Delete $n$ from $G^D$ |
| 10. While ($\exists$ dual nodes can be merged) (Merged-face-level detection) |
| 11.     Sort all dual nodes according to weight |
| 12.     Merge the two connected dual nodes with the max combined weight |
| 13.     If (the weight of the combined node $n_c > \epsilon_2$) |
| 14.         $S \leftarrow S \cup \{n_c\}$ |
| 15.         Delete $n_c$ from $G^D$ |
| 16. For all hotspots in $S$ |
| 17.     If (local wiring density $< d_0$) |
| 18.         Remove it from $S$ |

FIG. 11

METHOD AND APPARATUS FOR DETECTING LITHOGRAPHIC HOTSPOTS IN A CIRCUIT LAYOUT

FIELD OF THE INVENTION

The present invention relates to optical lithography, and in particular to a method for detecting hotspots induced by lithographic uncertainties.

BACKGROUND OF THE INVENTION

Moore's Law continues to drive higher performance with smaller circuit features. Aggressive technology scaling has introduced new variation sources and made process variation control more difficult. For optical lithography, manufacturability is roughly defined by the $k_1$ factor from the Rayleigh equation. Beyond the 45 nm CMOS technology node, even using a high-end optical exposure system such as immersion lithography with higher numerical aperture (NA), it is necessary to have a $k_1$ factor lower than 0.35. The primary risk posed by lower $k_1$ is the likelihood of degradation of patterning fidelity on VLSI circuits. Lower $k_1$ could decrease patterning fidelity and result in generation of many "hotspots." A hotspot is an actual device pattern which has relatively large critical dimension (CD) and image errors with respect to on-wafer targets. The critical dimension (CD), also known as line width or feature width, is the size (width) of a feature printed in resist, measured at a specific height above the substrate. Under ultra-low $k_1$ conditions ($k_1$<0.3), in particular, many hotspots may arise anywhere. Hotspots can form under a variety of conditions such as the original design being unfriendly to the resolution enhancement technique (RET) that is applied to the chip, pattern combinations unanticipated by rule-based optical proximity correction (OPC), or inaccuracies in model-based OPC. When these hotspots fall on locations that are critical to the electrical performance of a device, they can reduce the yield and performance of the device. It is therefore necessary to detect hotspots earlier in the layout design flow.

One known detection method for critical patterns (hotspots) includes using a design rule check (DRC) tool. The approach is a rule-based detection which generates lookup tables with line and space parameters. However, for more complex patterns, the number of layout pattern parameter required to enable detection increases. As a result, the speed advantage of the rule-based approach is reduced.

Thus, the simulation-based approach has occupied the mainstream and has been able to detect hotspots accurately. Further, software solutions running on customized hardware platforms have been developed so that aerial image simulation can be carried out quickly. However, hotspots can be changed according to process conditions. The accuracy requirement for hotspot detection strongly depends on qualified optical and process models. Model generation corresponding to process variation represents a significant overhead in terms of validation, measurement and parameter calibration.

SUMMARY OF THE INVENTION

The present invention is directed to a method and apparatus for detecting hotspots in a circuit layout, and includes constructing a layout graph having nodes, corner edges and proximity edges from the circuit layout, converting the layout graph to a corresponding dual graph, and iteratively selecting edges and nodes having weights greater than a predetermined threshold value at each iteration as hotspots.

BRIEF DESCRIPTION OF THE DRAWINGS

FIG. 7 is an example layout graph constructed in accordance with the flowchart shown in FIG. 6;

FIG. 8 is a diagram illustrating the edge weighting scheme used in constructing the layout graph shown in FIG. 7;

FIG. 9 is an illustration of a dual graph converted from the layout graph of FIG. 7;

FIG. 11 is an exemplary iterative dual node merging heuristic for the hotspot detection method of the present invention.

DETAILED DESCRIPTION OF THE PREFERRED EMBODIMENTS

Briefly, the present invention is directed to a detection method for hotspots induced by lithographic uncertainty. The hotspot detection method includes building a layout graph which reflects pattern-related critical dimension (CD) variation. Given a layout L, the layout graph G=(V, Ec∪Ep) consists of nodes V, corner edges Ec and proximity edges Ep between the nodes V. A face in the layout graph includes several close features and the edges between them. The weight given to the edges is calculated from a traditional 2-D model. Then a three-level hotspot detection is applied: (1) edge-level detection finds the hotspot caused by two close features or "L-shaped" features; (2) face-level detection finds the pattern-related hotspots which span several close features; and (3) merged-face-level detection finds hotspots with more complex patterns. To find the merged faces which capture the pattern-related hotspots, the layout is converted into a planar graph G. Then its dual graph $G^D$ is constructed and the dual nodes are sorted according to their weights. The sorted dual nodes (i.e., the faces in G) that share a given feature are merged in sequence.

Hotspots are the locations in the design where the magnitude of edge displacement (i.e., a skew between the edge drawn in a layout and the edge of a feature printed in resist) is exceptionally large. In other words, hotspots are printed features whose CD variations are greater than a given threshold value, i.e., the value of CD is larger than the feature or line size (width) of the desired design. In accordance with one embodiment of the present invention, the hotspot detection problem is formulated as follows: 1) Given layout L and threshold of CD variation which defines a hotspot; 2) detect hotspots which may result in large CD variation; 3) to minimize the number of undetected hotspots and falsely detected hotspots.

Figures 1A, 1B, 1C:
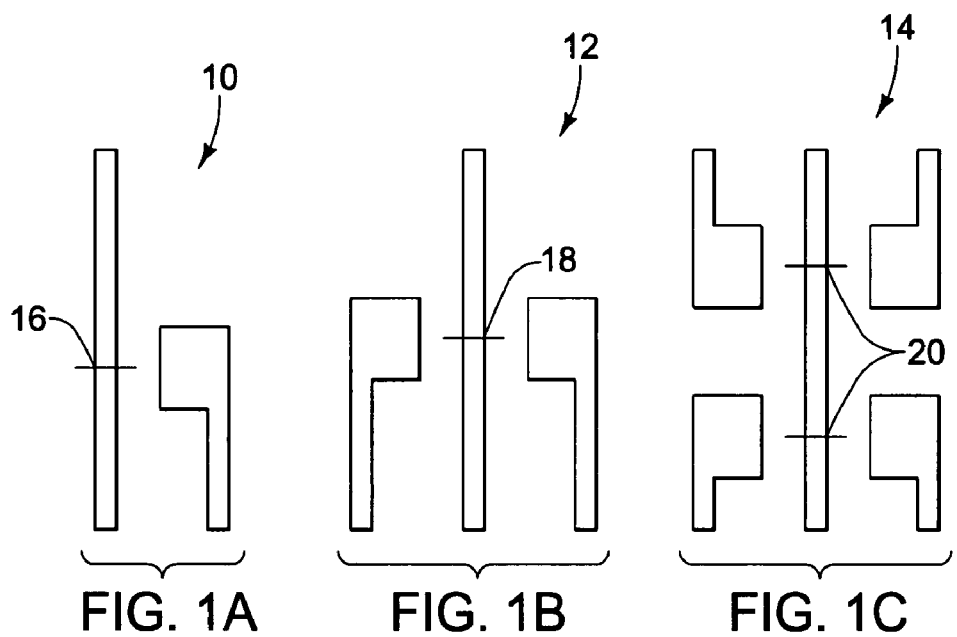
FIGS. 1A-1C show example test patterns for evaluation of critical dimension (CD) variation induced by different pattern complexities.

Turning now to FIGS. 1A-1C, example test patterns 10, 12, 14 for evaluating CD variations induced by different pattern complexities are shown. FIGS. 1A-1C show patterns 10, 12, 14 with three different complexities, one wide metal line, two wide metal lines, and four wide metal lines, respectively. Lines 16, 18, 20 show CD measurement locations (two CD values are averaged in the case of the test pattern 14). The basic function for detection depends on process variations such as defocus which is the distance, measured along the optical axis (i.e., perpendicular to the plane of best focus) between the position of a resist-coated wafer and the position if the wafer were at best focus), and exposure which is the process of subjecting a resist to light energy (or electron energy in the case of electron beam lithography) for the purpose of causing chemical change in the resist), and pattern parameters (i.e., width and space).

Figure 2:
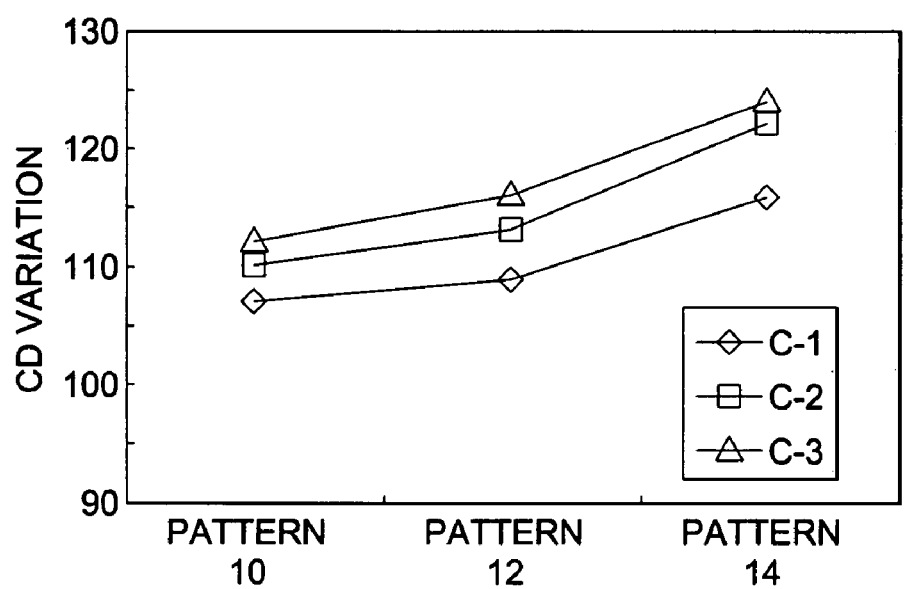
FIG. 2 is a graph showing the CD variations of the test patterns shown in FIGS. 1A-1C.

FIG. 2 shows the CD variations of the test patterns shown in FIGS. 1A-1C at three different process conditions:

Condition-1: NA=0.85 and σ=0.96/0.76;
Condition-2: NA=0.75 and σ=0.75/0.55;
Condition-3: NA=0.75 and σ=0.75/0.45;

where NA is the sine of the maximum half-angle of light that can make it through a lens of a lithography system, multiplied by the index of refraction of the media, and partial coherence (σ) is the ratio of the sine of the maximum half-angle of illumination striking the mask to the numerical aperture of the objective lens of the lithography system. Partial coherence, as known in the art, is also called the degree of coherence, the coherence factor, or the pupil filling function. FIG. 2 shows that different complexities lead to different CD variations. Also, the CD variation may be affected by different process conditions. However, the patterns with more complex configuration, e.g., the pattern 14 in FIG. 1C, have larger CD variation than the patterns with simple complexity, e.g., the pattern 10 in FIG. 1A, at any process conditions. Therefore, an observation is that the higher the pattern complexity, the higher the probability of a hotspot.

Figure 3A:
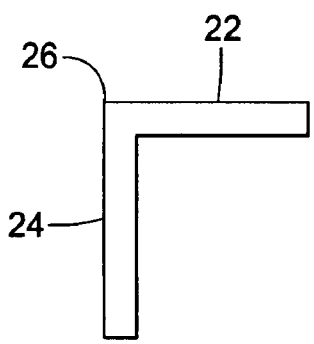
FIGS. 3A-3C show examples of a corner induced CD variation and a proximity induced CD variation.
Figure 3B:
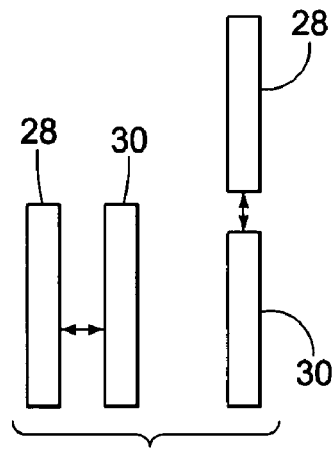
Figure 3C:
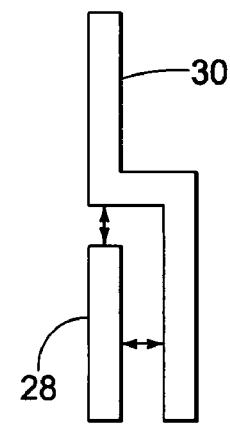

Referring to FIGS. 3A-3C, pattern-induced CD variations are grouped into two cases in accordance with the graph-based detection of the present invention: 1) corner induced CD variation; and 2) proximity induced CD variation. In the corner induced CD variation (shown in FIG. 3A), two orthogonally connected features 22, 24 form a corner 26 which may lead to "corner rounding" CD variations, and in the proximity induced CD variation (shown in FIGS. 3B and 3C), two close features 28, 30 may lead to "shortening" or "bridging" CD variations.

Figure 4A:
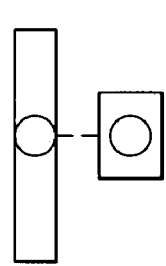
FIGS. 4A-4C illustrate the accumulative effect of hotspots in a lithographic pattern.
Figure 4B:
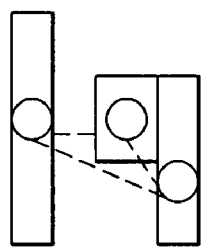
Figure 4C:
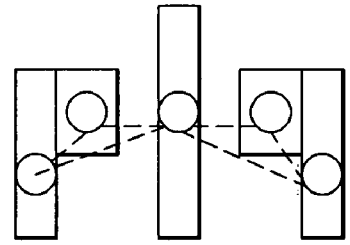

In lithography, a given hotspot may be the result of a single (proximity) effect (represented by a dotted line in FIG. 4A), or the combination of several (proximity and corner) effects in an accumulative way as shown in FIGS. 4B and 4C. The accumulative property of hotspots make detection and filtering very difficult. In the present invention, this accumulative effect is formulated with an iterative merging process.

Figure 5:
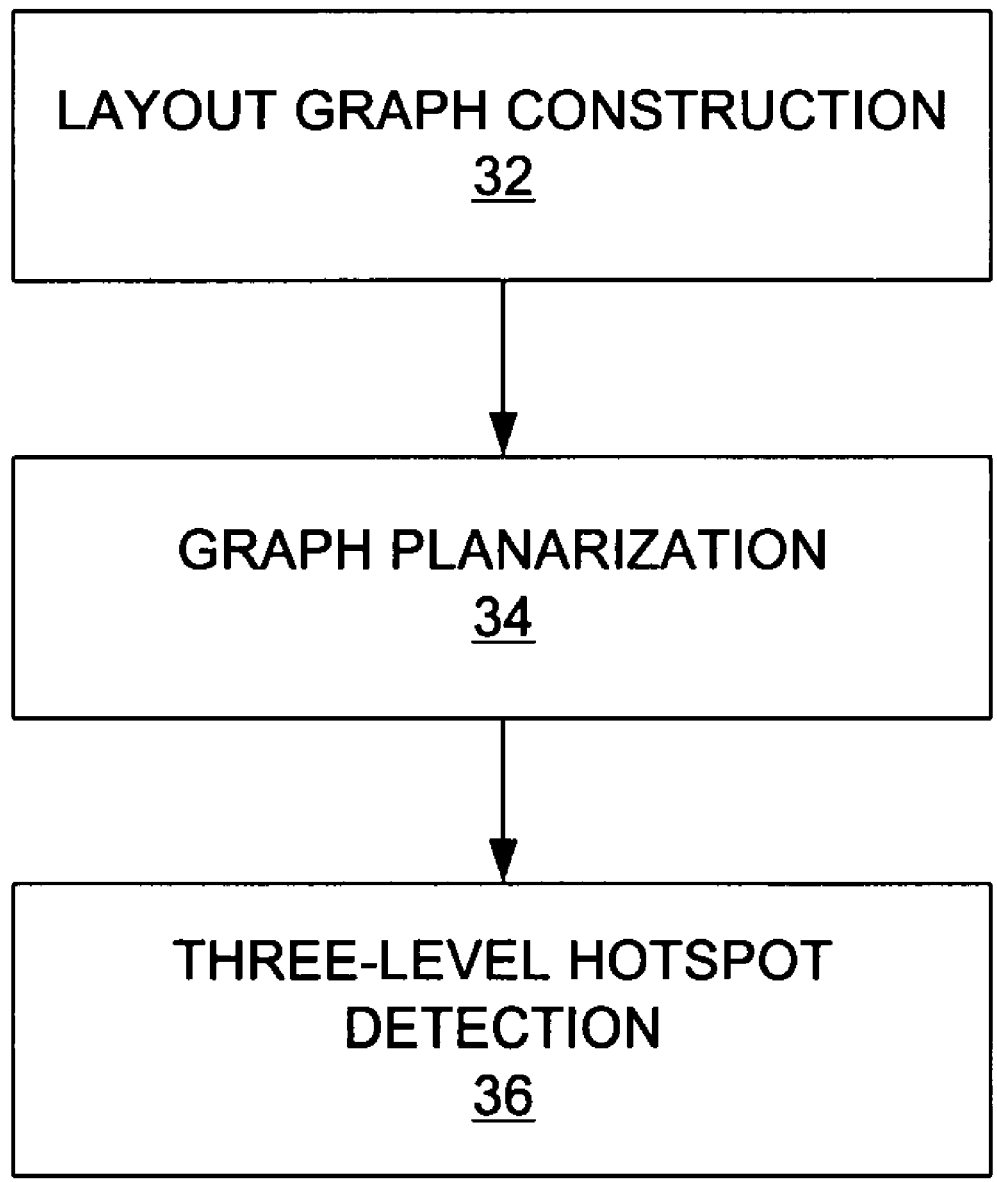
FIG. 5 is a flowchart describing a detection method in accordance with one embodiment of the present invention.

Turning now to FIG. 5, hotspot detection in accordance with one embodiment of the present invention includes layout graph construction (block 32), graph planarization (block 34) and three-level hotspot detection (block 36). Layout graph construction entails constructing a layout graph G=(V, Ec∪Ep) for a given layout L, which includes nodes V, corner edges Ec and proximity edges Ep (block 32). In graph planarization, one edge (the dotted lines shown in FIGS. 4B and 4C) with the smaller weight is deleted for any two crossing edges, i.e., two edges which share a common point, which is not the end point of the two edges (block 34). Three-level hotspot detection performs edge-level (shown in FIG. 4A), face-level (FIG. 4B) and merged-face-level (FIG. 4C) detection to find hotspots with complex patterns.

Figure 6:
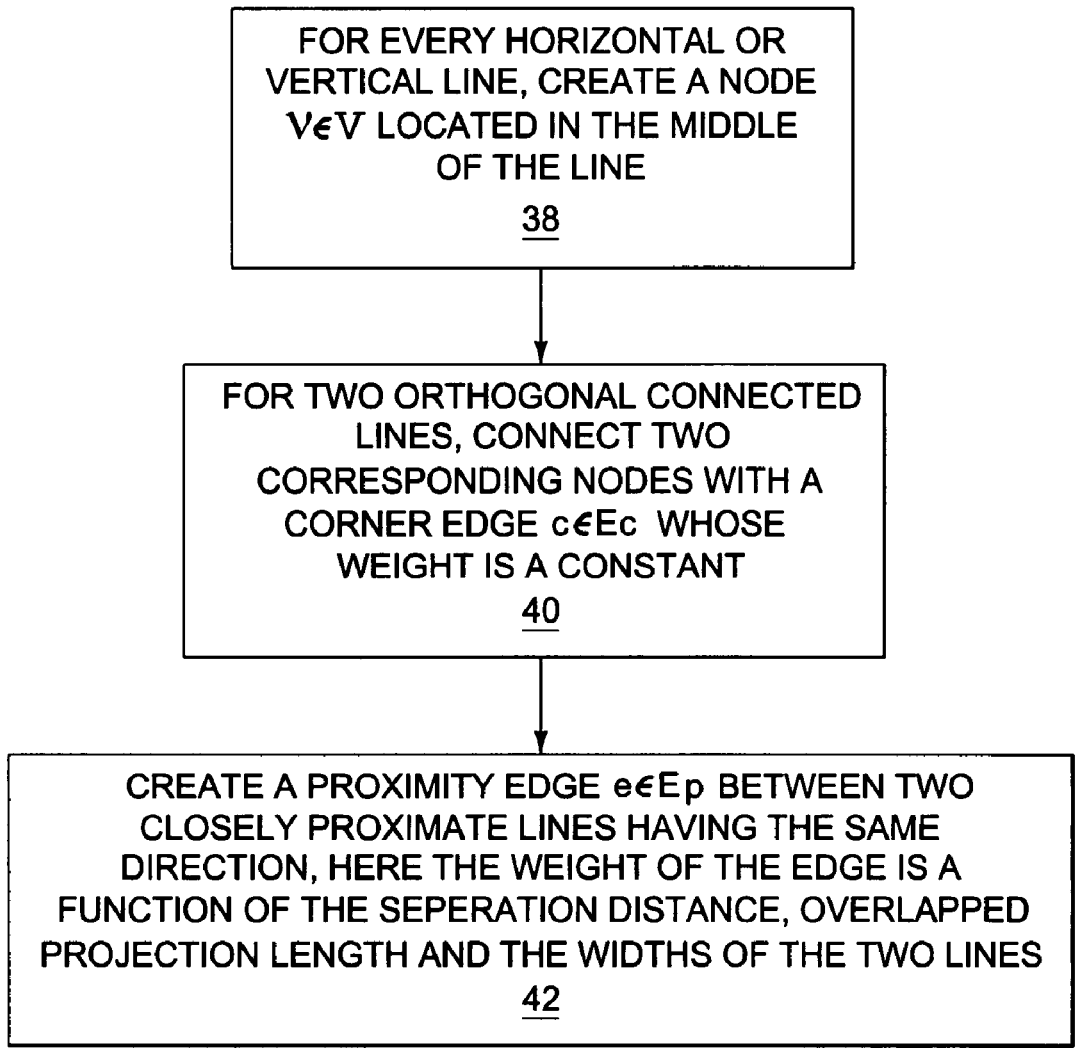
FIG. 6 is a flowchart describing a method for constructing a layout graph.

Turning now to FIG. 6, a process for building a layout graph which reflects the pattern-related CD variation is shown. Given a layout L, the layout graph G=(V, Ec∪Ep) includes nodes V, corner edges Ec and proximity edges Ep. For every horizontal 44 or vertical line 46, create a node v∈V located in the middle of the line (see e.g., dark circles in FIG. 7) (block 38). For two orthogonally connected lines, connect two corresponding nodes with a corner edge (dotted lines in FIG. 7) c∈Ec whose weight is a constant (block 40). Create a proximity edge (solid lines in FIG. 7) e∈Ep between two closely proximate lines having the same direction, where the weight of the edge is a function of the separation distance, overlapped projection length and the widths of the two lines (block 42).

FIG. 7 is an example of a layout graph G converted from the layout L. The layout graph G has seven nodes (dark circles) representing seven lines 44, 46, four corner edges (dashed lines) and 5 proximity edges (solid lines) connecting the nodes. The edge weighting scheme employed in the present invention is preferably a closed-form formula based weighting scheme. The weights of corner edges are assumed to be a constant c.

As shown in FIG. 8, in the closed-form formula based weighting scheme, the weights of the proximate edges are given by $w_1 \times w_2 \times 1/d$, where $w_1$ and $w_2$ are the widths of the two features 48, 50, l is the length of the overlapped projection of the two features, and d is the distance between the two features. The approximate effect is more obvious for larger width features with smaller distance and large overlapped projection length.

The next step after layout graph construction is to convert the planar layout graph G=(V, Ec∪Ep) into its dual graph $G^D=(V^D, E^D \cup UE^D)$, i.e., perform graph planarization (see FIG. 5). FIG. 9 shows a dual graph $G^D$ converted from the layout graph G of FIG. 7. As used in the specification, the dual graph $G^D$ of the layout graph G is constructed by representing every face f of G, i.e., every region bounded by edges, with a dual node n whose weight is equal to the sum of the edge weights of f. An edge e which belongs to faces f1 and f2 in G is represented with a dual edge $e^d=\{n1, n2\}$ in $G^D$ with the same weight of e. It should be understood that the dual graph $G^D$ exists if G is a planar graph, i.e., there are no crossing edges. Therefore, for any two crossing edges in G, the edge with smaller weight is deleted.

In the present invention, the hotspot is viewed as the result of the combination of several locally related "bad" patterns. With the assumption that the CD variation effect is cumulative, the effect can be reflected by the dual node weight, i.e., the total edge weight of one face. However, a hotspot may also relate to the lines of several faces. Therefore, it is needed to consider dual nodes merging to capture all possible hotspots.

Figure 10:
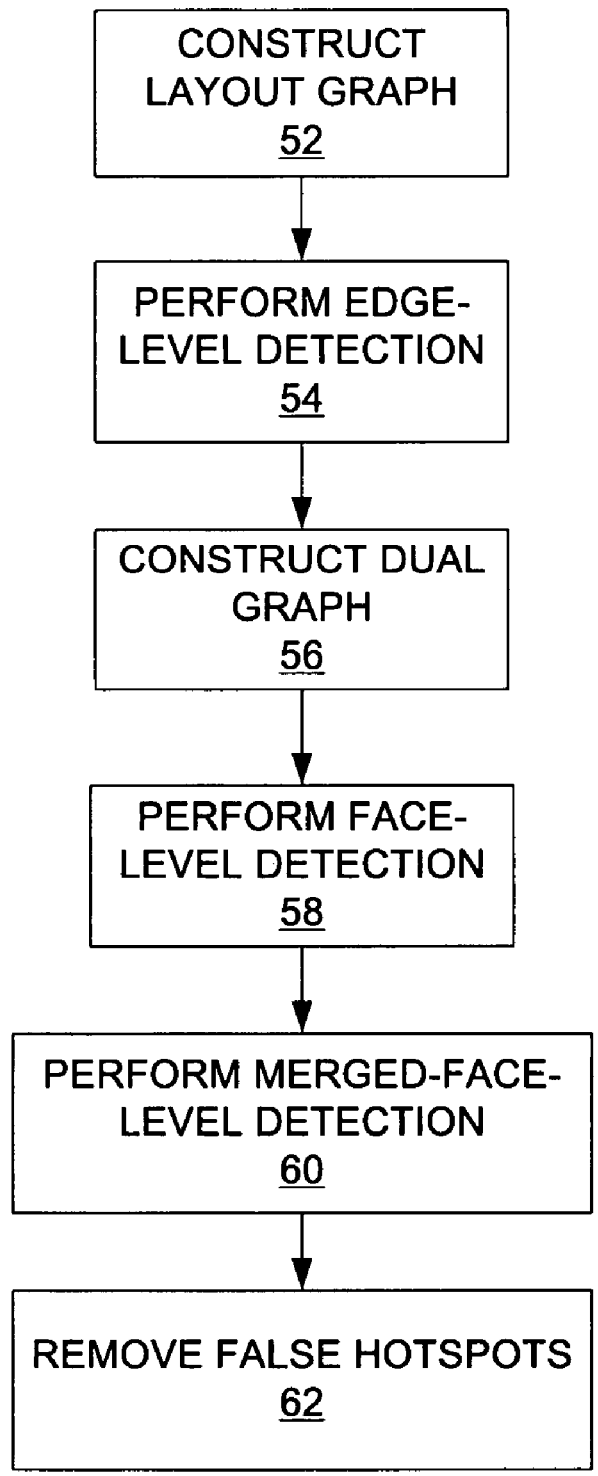
FIG. 10 is a flowchart describing the three-level hotspot detection process.

Turning now to FIG. 10, the three-level hotspot detection process (see FIG. 5) in accordance one embodiment of the invention is described with respect to the layout L, given user defined threshold values $\epsilon_0, \epsilon_1, \epsilon_2, d_0$. After the layout graph G is constructed as described above (block 52), edge-level detection is performed according to the following (block 54):

For all edges e whose weight is $> \epsilon_0$
  S ← S U {e}
  Delete e from G, where S is a set of hotspots. Thus, all edges e whose weights are greater than $\epsilon_0$ are selected as hotspots.

Then one edge with smaller weight for any pair of crossing edges is deleted to make the layout graph G a planar graph and construct dual graph $G^D$ from graph G, as described above (block 56). Face-level hotspot detection is then performed as follows (block 58):

```
For all dual nodes n whose weight > ∈₁
    S ← S U {n}
    Delete e from G^D
```

Thus, all faces (or dual notes) whose total edge weight are greater than $\in$ are selected as hotspots.

Finally, a merged-face-level detection is performed by sorting dual nodes according to weights and iteratively merging two connected dual nodes (block 60).

```
Sort all dual nodes according to weight,
Merge the two connected dual nodes with the max combined weight
(replace two connected dual nodes with a node having combined
weights of two replaces nodes)
If the weight of the combined node n_c > ∈₂
    S ← S U { n_c}
    Delete n_c from G^D
```

Thus, all merged faces whose total edge weight is greater than $\in_2$ are selected as hotspots.

After the merged-face-level detection some of the hotspots are removed as follows (block 62):

```
For all hotspots in S
    If local wiring density < d₀
        Remove it from S.
```

From all the hotspots S selected from the edge-level, face-level and merged-level detection steps, those hotspots with local wiring density smaller than $d_o$ are removed from S.

In this manner, a local wiring density based hotspots filter is used to reduce the number of falsely detected hotspots. An exemplary iterative dual-node merging heuristic implemented in C++ is shown in FIG. 11.

Figure 12:
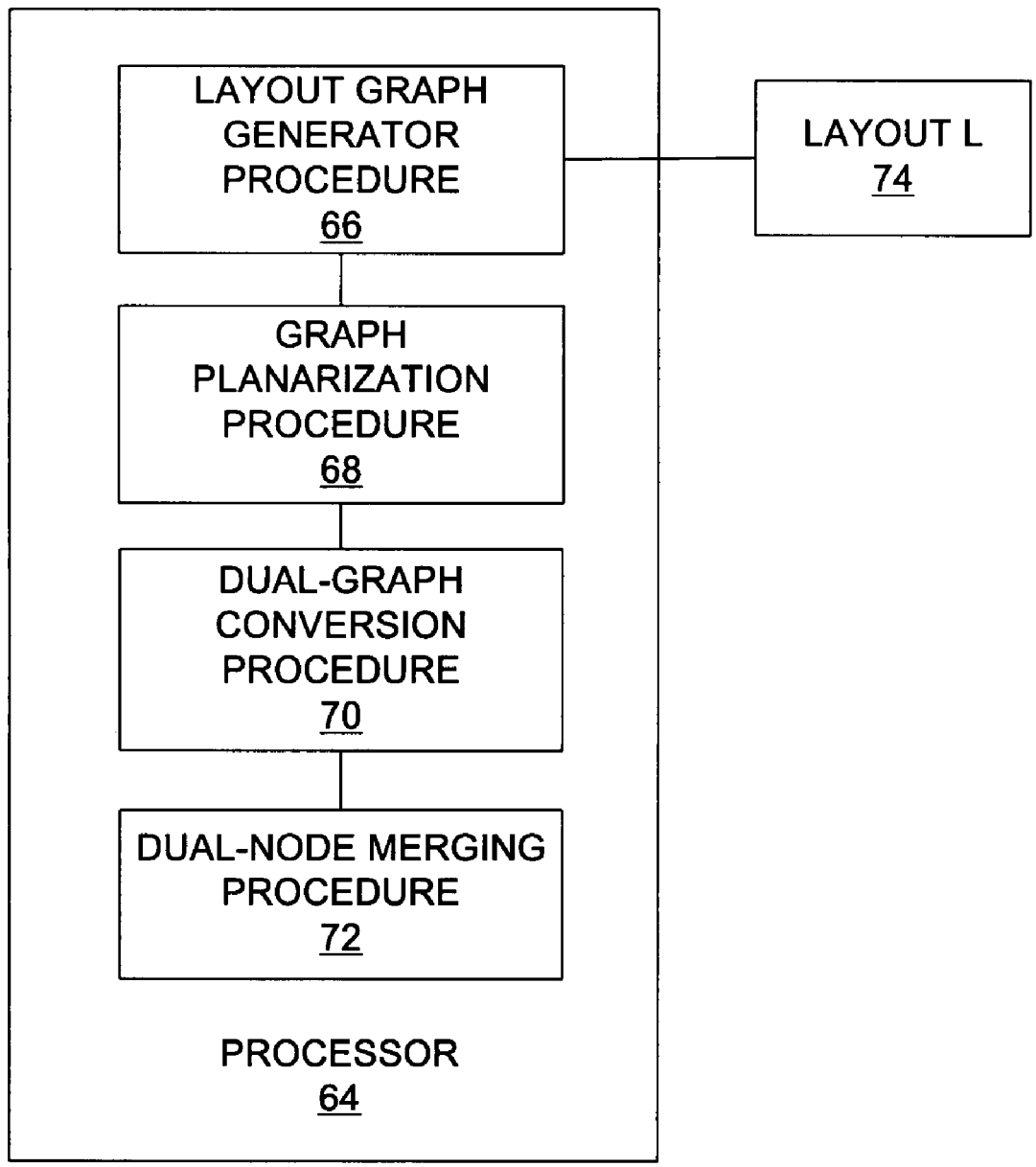
FIG. 12 is a block diagram illustrating a system for implementing the hotspot detection method of the present invention.

Turning now to FIG. 12, the hotspot detection method of the present invention is preferably implemented in a processor 64 including a procedure 66 for generating the layout graph G for a given layout, a procedure 68 for graph planarization, a procedure 70 for converting the layout graph into its dual graph, and a procedure 72 for implementing the dual-node merging heuristic. Preferably, the procedures 66-72 are software codes or programs for run on the processor 64. The circuit layout L 74 is stored in a GDS file.

While a specific embodiment of the present invention has been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. A processor executed method for detecting hotspots in a circuit layout, comprising:
   constructing a layout graph G=(V, Ec∪Ep) from the circuit layout where V represents nodes, Ec represents corner edges and Ep represents proximity edges;
   converting said layout graph to a corresponding dual graph $G^D=(V^D, E^D \cup E^D)$; and
   iteratively selecting edges and nodes having weights greater than a predetermined threshold value at each iteration as hotspots, wherein said construction of said layout graph G=(V, Ec∪Ep) comprises:
   creating the nodes v∈V in a select location of each horizontal or vertical line;
   for two orthogonally connected lines, connecting two corresponding nodes with the corner edges c∈Ec having a constant weight;
   creating proximity edges e∈Ep between two closely proximate lines having the same direction, said proximity edges having weights generated from a closed-form formula based weighting scheme.

2. The method as defined in claim 1, wherein said closed-form formula based weighting scheme comprises $w_1 \times w_2 \times 1/d$, where $w_1$ and $w_2$ are widths of two lines, l is a length of an overlapped projection of the two lines, and d is a distance between the two lines.

3. The method as defined in claim 1, wherein said select location of the nodes is approximately the middle of said each horizontal or vertical line.

4. The method as defined in claim 1 wherein said dual graph $G^D$ is constructed by representing every face f of layout graph G with a dual node n whose weight is equal to a sum of edge weights of a face f, and an edge e which belongs to faces f1 and f2 in said layout graph G being represented with a dual edge $e^d$={n1, n2} in said dual graph $G^D$ with the same weight of said edge e.

5. The method as defined in claim 4, wherein an edge with a smaller weight is deleted for any two edges that cross in said layout graph G when said layout graph G is converted to said dual graph $G^D$.

6. The method as defined in claim 1, further comprising removing false hotspots having a local wiring density smaller than a fourth predetermined threshold value from said selected hotspots.

7. A processor executed method for detecting hotspots in a circuit layout, comprising:
   constructing a layout graph G=(V, Ec∪Ep) from the circuit layout where V represents nodes, Ec represents corner edges and Ep represents proximity edges
   converting said layout graph to a corresponding dual graph $G^D=(V^D, E^D \cup E^D)$; and
   iteratively selecting edges and nodes having weights greater than a predetermined threshold value at each iteration as hotspots, wherein said iterative selection of the hotspots comprises:
   selecting all edges having a weight greater than a first predetermined threshold value from the layout graph;
   selecting all faces having total edge weight greater than a second predetermined threshold value from said dual graph, wherein said dual graph, and is constructed by representing every face f of said layout graph G with a dual node n whose weight is equal to a sum of edge weights of said face f, and an edge e which belongs to faces f1 and f2 in said layout graph G being represented with a dual edge $e^d$={n1, n2} in said dual graph $G^D$ with the same weight of said edge e; and selecting merged dual nodes having weights greater than a third predetermined threshold value, wherein said weight of said merged dual node is a total weight of two combined dual nodes.

8. An apparatus for detecting hotspots in a circuit layout, comprising:
   a layout graph generating program executed in a processor for generating a layout graph G=(V, Ec∪Ep) where V represents nodes, Ec represents corner edges and Ep represents proximity edges;
   a converting program executed in the processor for converting said layout graph to a corresponding dual graph $G^D=(V^D, E^D\cup E^D)$; and
   a hotspot selecting program executed in the processor for iteratively selecting edges and nodes having weights greater than a predetermined threshold value at each iteration as hotspots, wherein said layout graph generating program constructs said layout graph G=(V, Ec∪Ep) by creating the nodes v∈V in a select location of each horizontal or vertical line; for two orthogonally connected lines, connecting two corresponding nodes with the corner edges c∈Ec having a constant weight; and creating proximity edges e∈Ep between two closely proximate lines having the same direction, said proximity edges having weights generated from a closed-form formula based weighting scheme.

9. The apparatus as defined in claim 8, wherein said closed-form formula based weighting scheme comprises $w_1 \times w_2 \times 1/d$, where $w_1$ and $w_2$ are widths of two lines, l is a length of an overlapped projection of the two lines, and d is a distance between the two lines.

10. The apparatus as defined in claim 8, wherein said select location of the nodes is approximately the middle of said each horizontal or vertical line.

11. The apparatus as defined in claim 8, wherein the layout graph generating program retrieves the circuit layout from a GDS file.

12. The apparatus as defined in claim 8, wherein said layout graph generating program, said converting program and said hotspot selecting program are programmed in C++.

13. An apparatus for detecting hotspots in a circuit layout, comprising:
   a layout graph generating program executed in a processor for generating a layout graph G=(V, Ec∪Ep) where V represents nodes, Ec represents corner edges and Ep represents proximity edges;
   a converting program executed in the processor for converting said layout graph to a corresponding dual graph $G^D=(V^D, E^D\cup E^D)$; and
   a hotspot selecting program executed in the processor for iteratively selecting edges and nodes having weights greater than a predetermined threshold value at each iteration as hotspots, wherein said converting program constructs said dual graph $G^D$ by representing every face f of said layout graph G with a dual node n whose weight is equal to a sum of edge weights of said face f, and an edge e which belongs to faces f1 and f2 in said layout graph G being represented with a dual edge $e^d=\{n1, n2\}$ in said dual graph $G^D$ with the same weight of said edge e.

14. The apparatus as defined in claim 13, wherein said converting program deletes an edge with a smaller weight for any two edges that cross in said layout graph G when said layout graph G is converted to said dual graph $G^D$.

15. An apparatus for detecting hotspots in a circuit layout, comprising:
   a layout graph generating program executed in a processor for generating a layout graph G=(V, Ec∪Ep) where V represents nodes, Ec represents corner edges and Ep represents proximity edges;
   a converting program executed in the processor for converting said layout graph to a corresponding dual graph $G^D=(V^D, E^D\cup E^D)$ and
   a hotspot selecting program executed in the processor for iteratively selecting edges and nodes having weights greater than a predetermined threshold value at each iteration as hotspots, wherein said hotspot selecting program iteratively selects the hotspots by,
   selecting all edges having a weight greater than a first predetermined threshold value from the layout graph;
   selecting all faces having total edge weight greater than a second predetermined threshold value from said dual graph, wherein said dual graph, and is constructed by representing every face f of said layout graph G with a dual node n whose weight is equal to a sum of edge weights of said face f, and an edge e which belongs to faces f1 and f2 in said layout graph G being represented with a dual edge $e^d=\{n1, n2\}$ in said dual graph $G^D$ with the same weight of said edge e; and
   selecting merged dual nodes having weights greater than third predetermined threshold value, wherein said weight of said merged dual node is a total weight of two combined dual nodes.

\* \* \* \* \*

UNITED STATES PATENT AND TRADEMARK OFFICE
CERTIFICATE OF CORRECTION

| | | |
|---|---|---|
| PATENT NO. | : 7,945,870 B2 | Page 1 of 1 |
| APPLICATION NO. | : 11/725396 | |
| DATED | : May 17, 2011 | |
| INVENTOR(S) | : Kahng et al. | |

It is certified that error appears in the above-identified patent and that said Letters Patent is hereby corrected as shown below:

Col. 1, line 46      After "layout pattern" delete "parameter" and insert --parameters-- therefor.

Col. 3, line 14      Delete "at best focus)," and insert --at best focus,-- therefor.

Col. 3, line 17      Before "and pattern" delete "resist)," and insert --resist,-- therefor.

Col. 4, line 54      Between "accordance" and "one" insert --with--.

Col. 5, line 24      Delete "of two replaces nodes" and insert --of two replaced nodes-- therefor.

Col. 6, line 50
Claim 7, line 5      After "proximity edges" insert a --;--.

Col. 6, line 61
Claim 7, line 16      Delete "dual graph, and is" and insert --dual graph is-- therefor.

Col. 8, line 26
Claim 15, line 9      Before "and" insert a --;--.

Col. 8, line 36
Claim 15, line 19      Delete "dual graph, and is" and insert --dual graph is-- therefor.

Col. 8, line 43
Claim 15, line 26      After "greater than" insert --a--.

Signed and Sealed this
Twenty-seventh Day of September, 2011

David J. Kappos
*Director of the United States Patent and Trademark Office*